United States Patent [19]

Morigami

[11] Patent Number: 5,124,949
[45] Date of Patent: Jun. 23, 1992

[54] SEMICONDUCTOR MEMORY DEVICE WITH A REDUNDANT MEMORY CELL ARRAY

[75] Inventor: Seiichi Morigami, Tokyo, Japan

[73] Assignee: NEC Corporation, Tokyo, Japan

[21] Appl. No.: 615,739

[22] Filed: Nov. 19, 1990

[30] Foreign Application Priority Data

Nov. 17, 1989 [JP] Japan .................................. 1-299321

[51] Int. Cl.$^5$ .............................................. G11C 11/40
[52] U.S. Cl. .................... 365/210; 365/226; 365/190; 365/189.05
[58] Field of Search ........... 365/210, 190, 226, 189.01, 365/189.05, 230.01

[56] References Cited

U.S. PATENT DOCUMENTS 4,982,364  1/1991  Iwahashi .............................. 365/210

*Primary Examiner*—Terrell W. Fears
*Attorney, Agent, or Firm*—Sughrue, Mion, Zinn, Macpeak & Seas

[57] ABSTRACT

A semiconductor memory device with a redundant memory cell array includes two transfer gate circuits. The first transfer gate circuit transfers a signal selected from two signals, one of which from a first detecting circuit for detecting a selection of a redundant memory cell array to substitute an ordinary memory cell which includes a faulty memory cell, the other from a second detecting circuit for detecting an address of the ordinary memory cell array including the faulty memory cell. The second transfer gate circuit transfers a signal transferred from the first transfer gate circuit when the semiconductor memory device is not in a write enable state. When the semiconductor memory device is not in a write enable state, it is possible to detect a selection of the redundant memory cell array or an address of the ordinary memory cell array including the faulty memory cell, by monitoring the state of an output terminal of the semiconductor memory cell.

11 Claims, 3 Drawing Sheets

SEMICONDUCTOR MEMORY DEVICE WITH A REDUNDANT MEMORY CELL ARRAY

FIELD OF THE INVENTION

This invention relates to a semiconductor memory device with a redundant memory cell array, and more particularly to, a semiconductor memory device with a redundant memory cell array in which a substitution of an ordinary memory cell array including a faulty memory cell by a redundant memory cell array and an address of the ordinary memory cell array including the faulty memory cell are detected.

BACKGROUND OF THE INVENTION

A conventional semiconductor memory device with a redundant memory cell array includes first and second roll call circuits, in which the first roll call circuit receives a select signal supplied from redundant memory cell array selecting circuits of the semiconductor memory device, and the second roll call circuit receives an address signal supplied from program circuits of the semiconductor memory device. When the select signal is produced for selecting a redundant memory cell array for substituting an ordinary memory cell array including a faulty memory cell of the semiconductor memory device, a current which flows through the first roll call circuit changes. On the other hand, when the address signal which selects the ordinary memory cell array including the faulty memory cell is produced during the generation of the select signal, a current which flows through the second roll call circuit changes. Consequently, it is possible to detect a selection of a redundant memory cell array for substituting an ordinary memory cell array including a faulty memory cell by monitoring a current change of the first roll call circuit. On the other hand, it is possible to detect an address of the ordinary memory cell array including the faulty memory cell by monitoring a current change of the second roll call circuit.

In the conventional semiconductor memory device with a redundant memory cell array, however, there is a disadvantage in that a consumption of an electric power due to the current flow in the semiconductor device becomes large, when a redundant memory cell array is used in stead of an ordinary memory cell array which includes a faulty memory cell, because currents which flow through the two roll call circuits increase during the operation of the semiconductor memory device.

Moreover, there is a further disadvantage in that it tends to be difficult to detect the use of the redundant memory cell array, and the address of the ordinary memory cell array including the faulty memory cell by monitoring the current changes of the roll call circuits, if the consumption currents themselves are relatively large to decrease the proportion of the current change.

SUMMARY OF THE INVENTION

Accordingly, it is an object of the invention to provide a semiconductor memory device with a redundant memory cell array in which a consumption current is relatively small.

It is a further object of the invention to provide a semiconductor memory device with a redundant memory cell array in which a use of a redundant memory cell array substituted for an ordinary memory cell which includes a faulty memory cell and an address of the ordinary memory cell array including the faulty memory cell can be precisely detected.

According to the invention, a semiconductor memory device with a redundant memory cell array, comprises:

means for selecting a redundant memory cell array to substitute a faulty ordinary memory cell array which includes a faulty memory cell;

first detecting means for detecting a selection of the redundant memory cell array to produce a select signal;

second detecting means for detecting an address of the faulty ordinary memory cell array to produce a first address signal;

first transferring means for transferring a signal selected from the select signal and the first address signal;

second transferring means for transferring a signal transferred from the first transferring means; and means for controlling a state of an output terminal of the semiconductor memory device in accordance with a signal transferred from the second transferring means.

BRIEF DESCRIPTION OF THE DRAWINGS

The invention will be explained in more detail in conjunction with appended drawings, wherein.

DESCRIPTION OF THE PREFERRED EMBODIMENTS

Before describing a semiconductor memory device with a redundant memory cell array according to the invention, the conventional semiconductor memory device with a redundant memory cell array briefly described before will be explained in conjunction with FIG. 1.

Figure 1:
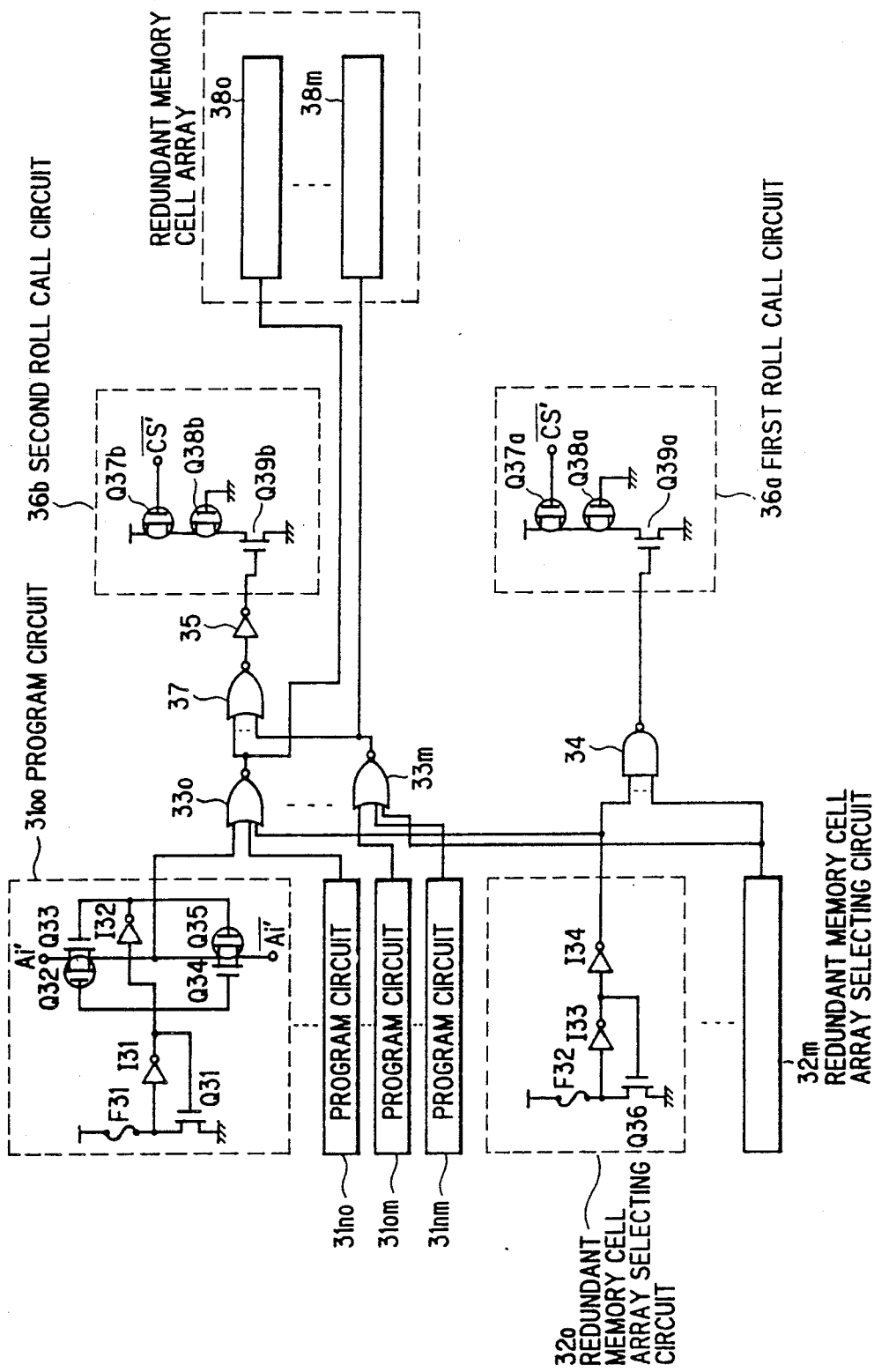
FIG. 1 is a block diagram showing a conventional semiconductor memory device with a redundant memory cell array.

FIG. 1 shows the conventional semiconductor memory device with a redundant memory cell array. The conventional semiconductor memory device with a redundant memory cell array comprises a plurality (n×m) of program circuits $31_{oo} \sim 31_{no}, \ldots, 31_{om} \sim 31_{nm}$, a plurality (m) of redundant memory cell array selecting circuits $32_o \sim 32_m$, a plurality (m) of NOR circuits $33_o \sim 33_m$, a NAND circuit 34, a NOR circuit 37 and an inverter circuit 35 which are connected in series, and first and second roll call circuits 36a and 36b.

Each of the program circuits $31_{oo} \sim 31_{no}, \ldots, 31_{om} \sim 31_{nm}$ comprises a fuse F3 connected at one terminal to a power supply, N-MOS transistors Q31, Q33 and Q34, P-MOS transistors Q32 and Q35, and inverter circuits I31 and I32. In this circuit, two transfer circuits which comprise two pairs of the transistors Q32 and Q33, and Q34 and Q35 are supplied with delay signals Ai' and $\overline{Ai}'$ of address input signals Ai and $\overline{Ai}$ (a symbol "'" which is added to a symbol of a signal indicates a delay signal of the signal hereinafter.).

Each of the redundant memory cell array selecting circuits $32_0 \sim 32_m$ comprises a fuse F32 connected at one terminal to a power supply, an N-MOS transistor Q36, and inverter circuits I33 and I34.

The first roll call circuit 36a comprises P-MOS transistors Q37a and Q38a and an N-MOS transistor Q39a which are connected in series. The transistor Q39a is connected at a gate terminal with an output of the NAND circuit 34. The transistor Q37a is supplied at a gate terminal with a delay chip select signal $\overline{CS}'$ and connected at a source terminal to a power supply.

The second roll call circuit 36b comprises P-MOS transistors Q37b and Q38b and an N-MOS transistor Q39b which are connected in series. The transistor Q39b is connected at a gate terminal with an output of the inverter circuit 35. The transistor Q37b is supplied at a gate terminal with the delay chip select signal $\overline{CS}'$ and connected at a source terminal to a power supply.

A plurality (m) of redundant memory cell arrays $38_0 \sim 38_m$ are provided to be substituted for an ordinary memory cell array, and is selected in accordance with outputs of the NOR circuits $33_0 \sim 33_m$.

In operation, if there is no faulty memory cell in ordinary memory cell arrays (not shown here), the cutting-off of fuses is not carried out in any circuit of the program circuits and the redundant memory cell array selecting circuits. In this case, outputs of all of the redundant memory cell array selecting circuits $32_0 \sim 32_m$ are at a high level, because a high level signal is applied through the fuse F32 to an input of the inverter circuit I33 in each selecting circuit, so that an output of the NAND circuit 34 is at a low level. As a result, the transistor Q39a of the first roll call circuit 36a remains in OFF state, so that no current flows through the first roll call circuit 36a.

On the other hand, the NOR circuits $33_0 \sim 33_m$ are all supplied with high level signals from the redundant memory cell array selecting circuits $32_0 \sim 32_m$, so that all outputs of the NOR circuits $33_0 \sim 33_m$ become low levels regardless of outputs of the program circuits $31_{00} \sim 31_{nm}$. Therefore, an output of the NOR circuit 37 becomes a low level, and an output of the inverter circuit 35 becomes a low level, respectively. As a result, the transistor Q39b of the second roll call circuit 36b remains in OFF state, so that no current flows through the second roll call circuit 36b.

If any faulty memory cell is detected in the ordinary memory cell array by a memory testing system, the cutting-off of the fuses is carried out in a corresponding circuit group of the program circuits $31_{00} \sim 31_{n0}, \ldots, 31_{0m} \sim 31_{nm}$, and a corresponding circuit of the redundant memory cell array selecting circuits $32_0 \sim 32_m$ by laser beam. Now, it is supposed that an ordinary memory cell array corresponding to the redundant memory cell array $38_0$ includes a faulty memory cell. In this case, the cutting-off of the fuses F31 in the first program circuit group $31_{00} \sim 31_{n0}$ and the fuse F32 of the redundant memory cell array selecting circuit $32_0$, respectively, corresponding to the redundant memory cell array $38_0$, is carried out.

By cutting-off of the fuse F32 of the redundant memory cell array selecting circuit $32_0$, an output of the inverter circuit I33 becomes a high level, and an output of the inverter circuit I34 becomes a low level, which is an output of the redundant memory cell array selecting circuit $32_0$. Therefore, an output of the NAND circuit 34 becomes a high level, so that the transistor Q39a of the first roll call circuit 36a becomes ON state. If the semiconductor memory device is in an operation state, the delay chip select signal $\overline{CS}'$ is at a low level, so that a current flows through the transistors $Q37a \sim Q39a$ of the first roll call circuit 36a.

Consequently, a consumption current becomes larger in the semiconductor memory device, for the reason that a current flows through the first roll call circuit 36a. Therefore, it is detected that a redundant memory cell array is used by detecting the increase of the consumption current, when the chip select signal $\overline{CS}$ turns to a low level.

On the other hand, the fuse F31 is cut off in each of the program circuits $31_{00} \sim 31_{n0}$, so that an output of the inverter circuit I31 becomes a high level, and an output of the inverter circuit I32 becomes a low level. Therefore, the transfer gate circuit which comprises the transistors Q32 and Q33 becomes OFF state, on the other hand, the transfer gate circuit which comprises the transistors Q34 and Q35 becomes ON state. When supplied with the delayed address input signals Ai' and $\overline{Ai}'$ for selecting the address of the ordinary memory cell array including the faulty memory cell, only the signal $\overline{Ai}'$ passes through the ON state-transfer gate, so that all of outputs of the program circuits $31_{00} \sim 31_{n0}$ become low levels. In this case, an output of the redundant memory cell array selecting circuit $32_0$ is at a low level, so that all inputs of the NOR circuit $33_0$ become low levels to provide an output of a high level therefrom. As a result, the redundant memory cell array $38_0$ is selected, and a gate terminal of the transistor Q39b of the second roll call circuit 36b receives a high level signal. Now, if the semiconductor memory device is in an operation state, the chip select signal $\overline{CS}$ is at a low level, so that a current flows through the transistors $Q37b \sim Q39b$ of the second roll call circuit 36b.

Consequently, when the address input signal for selecting the ordinary memory cell array including the faulty memory cell and the inverted signal thereof are supplied to the program circuits $31_{00} \sim 31_{n0}, \ldots, 31_{0m} \sim 31'_{nm}$, a current flows through the second roll call circuit 36b, so that it is possible to detect an address of the ordinary memory cell array including the faulty memory cell by monitoring a current change of the second roll call circuit 36b.

Figure 2:
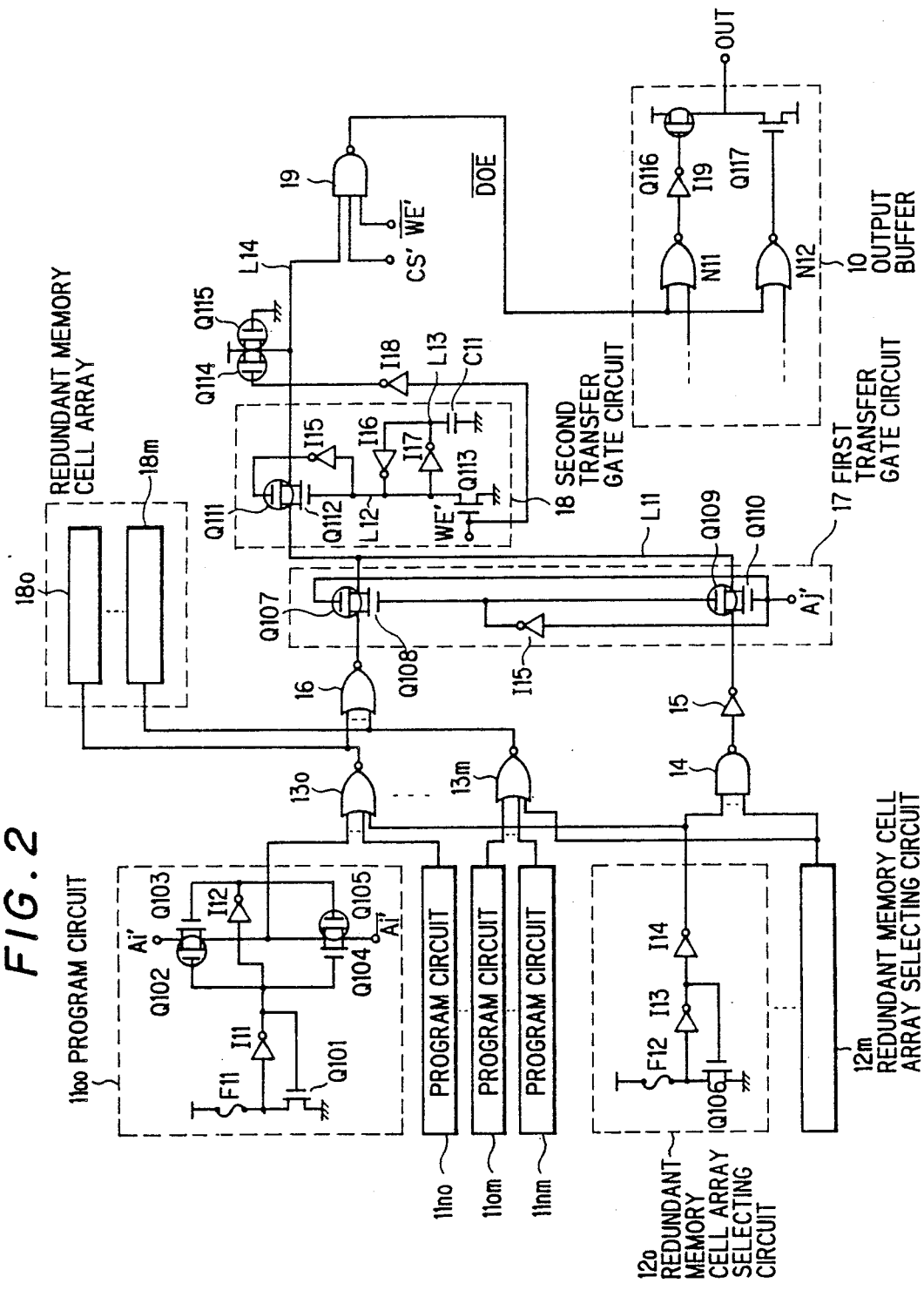
FIG. 2 is a block diagram showing a semiconductor memory device with a redundant memory cell array in a first preferred embodiment according to the invention.

Next, FIG. 2 shows a semiconductor memory device with a redundant memory cell array in a first preferred embodiment according to the invention. The semiconductor memory device with a redundant memory cell array comprises a plurality (n×m) of program circuits $11_{00} \sim 11_{n0}, \ldots, 11_{0m} \sim 11_{nm}$, a plurality (m) of redundant memory cell array selecting circuits $12_0 \sim 12_m$, a plurality (m) of NOR circuits $13_0 \sim 13_m$, NAND circuits 14 and 19, an inverter circuit 15, a NOR circuit 16, first and second transfer gate circuits 17 and 18, and an output buffer 10.

The program circuits $11_{00} \sim 11_{n0}, \ldots, 11_{0m} \sim 11_{nm}$ and the redundant memory cell array selecting circuits $12_0 \sim 12_m$ have the same structures as those in FIG. 1, respectively.

The transfer gate circuit 17 comprises P-MOS transistors Q107 and Q109, N-MOS transistors Q108 and Q110, and an inverter circuit 115. Two pairs of the transistors Q107 and Q108, and Q109 and 110 compose two transfer gates, respectively, one of which for transferring a signal supplied from the NOR circuit 16, the other for transferring a signal supplied from the inverter circuit 15, respectively. These transfer gates are selectively used to transfer the signals in accordance with a delay address input signal Aj', so that only one signal is transferred. In this case, a signal which selects bit lines is used as the delay address input signal Aj', if a signal which selects word lines is used as the delay address input signal Ai' which is supplied to the program circuits.

The transfer gate circuit 18 comprises a P-MOS transistor Q111, N-MOS transistors Q112 and Q113, inverter circuits I15~I17, and a capacitor C11. The two transistors Q111 and Q112 composes a transfer gate, which transfers a signal transferred from the transfer gate circuit 17 in accordance with a reversed delay write enable signal WE'. On the other hand, the two inverter circuits I16 and I17 composes a flip-flop circuit.

The output buffer 10 comprises NOR circuits N11 and N12, an inverter circuit I19, and P-MOS and N-MOS transistors Q116 and Q117. Inputs of the NOR circuits N11 and N12 are connected to an output of the NAND circuit 19, which are supplied with a signal transferred by the transfer gate circuit 18, a reversed chip select signal CS', and the delay write enable signal $\overline{WE'}$.

In this preferred embodiment, redundant memory cell arrays $18_0 \sim 18_m$ are connected to the NOR circuits $13_0 \sim 13_m$, respectively.

In operation, it is supposed that an ordinary memory cell array (not shown here) corresponding to the redundant memory cell array $18_0$ includes a faulty memory cell. In this case, the cutting-off of the fuses F11 in the program circuits $11_{00} \sim 11_{n0}$ is carried out so that outputs of the program circuits $11_{00} \sim 11_{n0}$ become low levels if an address of the ordinary memory cell array including the faulty memory cell is selected. The F12 of the redundant memory cell selecting circuit $12_0$ is also cut off.

Now, operation of detecting a use of a redundant memory cell array will be explained. At first, an electric power is supplied to the semiconductor memory device on a condition that the write enable signal $\overline{WE}$ is at a high level, the chip select signal $\overline{CS}$ is at a low level, and the address input signal Aj is at a high level. As the fuse F12 is cut off, an output of the inverter circuit 15 becomes a low level. On the other hand, an output of the NOR circuit $13_0$ turns to a low level, because the fuses F11 are cut off, when an address of the ordinary memory cell array including the faulty memory cell is selected.

In the transfer gate circuit 17, the delay address input signal Aj' is at a high level, so that only the transfer gate consisting of the P-MOS transistor Q109 and the N-MOS transistor Q110 becomes ON state. Consequently, a line L11 which is an output line of the transfer gate circuit 17 becomes a low level, which is the same level as that of an output of the inverter circuit 15.

In the transfer gate circuit 18, which is controlled by the reversed delay write enable signal WE', as the signal WE' is at a low level, the N-MOS transistor Q113 is in OFF state. On the other hand, an output points L13 and L12 of the flip-flop circuit consisting of the inverter circuits I17 and I16 become a low level and a high level, respectively, by an coupling effect which occurs between the capacitor C11 and ground, when an electric power is supplied to the semiconductor memory device. Therefore, the transfer gate consisting of the transistors Q111 and Q112 becomes ON state, so that a line L14 becomes a low level, which is the same as that of the line L11.

Consequently, an output control signal $\overline{DOE}$, which is supplied by the NAND circuit 19, becomes a high level, and outputs of the NOR circuits N11 and N12 become a low level, so that an output terminal OUT becomes a high impedance state, because the transistors Q116~Q117 are in OFF state.

Next, operation of detecting an address of the substituted ordinary memory cell array including the faulty memory cell will be explained. In this case, the delay address input signal Aj' is set to a low level, so that the transfer gate consisting of the transistors Q107 and Q108 of the transfer gate circuit 17 becomes ON state.

If the address of the ordinary memory cell array including the faulty memory cell is not selected, an output of the NOR circuit 16 becomes a high level, so that the lines L11 and L14 become a high level. Consequently, the output control signal $\overline{DOE}$ becomes a low level, so that the output terminal OUT is released from a high impedance state, and the output buffer 10 becomes a state for reading data from the memorys. Namely, the output terminal OUT becomes "1" level or "0" level in accordance with read signals which are supplied to the NOR circuits N11 and N12.

If an address of the ordinary memory cell array including the faulty memory cell is selected by the delay address input signals Ai' and $\overline{Ai'}$ which are changed, all outputs of the program circuits $11_{00} \sim 11_{n0}$ become low levels, so that an output of the NOR circuit $13_0$ becomes a high level, on the other hand, an output of the NOR circuit 16 becomes a low level. Consequently, the output control signal $\overline{DOE}$ becomes a high level, so that the output terminal OUT becomes a high impedance state.

On the other hand, if there is no ordinary memory cell array which includes a faulty memory cell, and the cutting-off of fuses of the program circuits $11_{00} \sim 11_{nm}$ and the redundant memory cell selecting circuits $12_0 \sim 12_m$ is not carried out, outputs of the inverter circuit 15 and the NOR circuit 16 become high levels, so that the output terminal OUT remains in a low impedance state.

Consequently, a detection of a substitution by a redundant memory cell array for an ordinary memory cell array which includes a faulty memory cell can be carried out precisely by monitoring an impedance state of the output terminal OUT, when the address input signal Aj is at a high level in a state that an electric power is turned on under a condition that the write enable signal $\overline{WE}$ is at a high level and the chip select signal $\overline{CS}$ is at a low level.

On the other hand, a detection of an address of the substituted ordinary memory cell array including the faulty memory cell can be carried out precisely, by monitoring an impedance state of the output terminal OUT while changing the address input signals Ai' and $\overline{Ai'}$ which are supplied to the program circuits, when the address input signal Aj is at a low level.

After supplying an electric power to the semiconductor memory device, when the write enable signal $\overline{WE}$ becomes a low level to be ready for writing, the reversed delay write enable signal WE' becomes a high level in the transfer gate circuit 18, so that the N-MOS transistor Q113 becomes ON state, and the output point L12 becomes a low level. After that, the output point L12 remains in a low level, independently of a level of the reversed delay write enable signal WE' by the flip-flop circuit consisting of the inverter circuits I16 and I17. Therefore, the transfer gate consisting of the transistors Q111 and Q112 becomes OFF state, so that the signal from the line L11 is shut off. At the same time, a P-MOS transistor Q114 is turned on by a low level signal of an inverter circuit I18, so that a transfer gate consisting of the transistor Q114 and a P-MOS transistor Q115 becomes ON state. As a result, the line L14 is at a high level.

In order to prevent the line L14 from becoming a floating state, the line L14 is maintained at a high level by the transfer gate consisting of the P-MOS transistors Q114 and Q115. The transistor Q114 is supplied at a gate terminal with the reversed delay write enable signal WE' by the inverter circuit I18, and the transistor Q115 is connected at a gate terminal to ground. Additionally, an ON resistance of the transistor Q115 is set sufficiently large so that a level of the line L14 may not change when the line L14 is at a low level.

In the semiconductor memory device with a redundant memory cell array, in this preferred embodiment, no current flows through any circuit of the semiconductor memory device, so that a consumption power in the semiconductor memory device which has a substituted redundant memory cell array is not larger than that in the semiconductor memory device which has no substituted redundant memory cell array.

Figure 3:
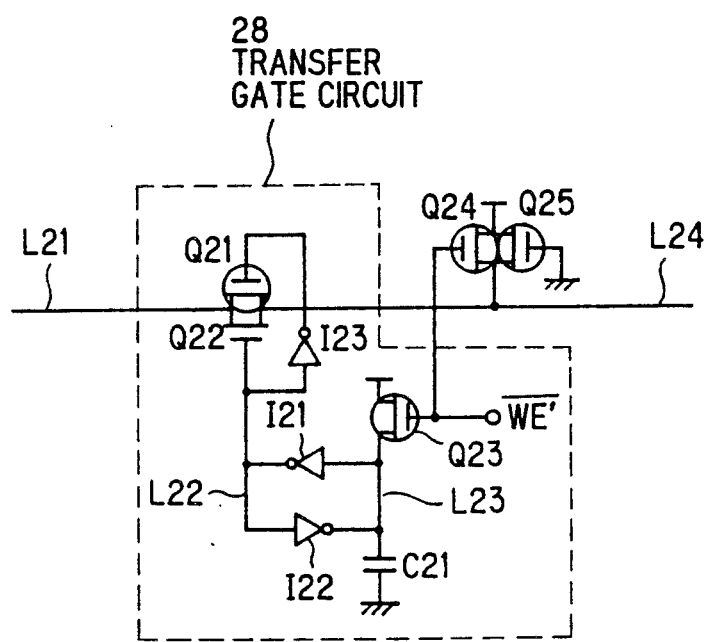
FIG. 3 is a block diagram showing a transfer gate circuit of a semiconductor memory device with a redundant memory cell array in a second preferred embodiment according to the invention.

FIG. 3 shows a transfer gate circuit of a semiconductor memory device with a redundant memory cell array in a second preferred embodiment. The structure of the semiconductor memory device is the same as that in FIG. 2, except that the structure of the transfer gate circuit 18 is replaced by that of the transfer gate circuit 28, which is controlled by a delay write enable signal $\overline{WE}'$. The transfer gate circuit 28 comprises P-MOS transistors Q21 and Q23, an N-MOS transistor Q22, inverter circuits I21~I23, and a capacitor C21. The structure of the transfer gate circuit is almost the same as that of the transfer gate circuit 18 in FIG. 2, however, the position of the transistor Q23 corresponding to the transistor Q13 of the transfer gate circuit 18 is different, and the transistor Q23 is supplied at a gate terminal with a delay write enable signal $\overline{WE}'$, while the transistor Q13 is supplied with the reversed delay write enable signal WE'.

In operation, when an electric power is supplied to the semiconductor memory device, in a state that a write enable signal $\overline{WE}$ is at a high level, an output points L22 and L23 of a flip-flop circuit which consists of the inverter circuits I21 and I22 become a low level and a high level, respectively. Accordingly, a transfer gate which consists of the transistors Q21 and Q22 becomes ON state, so that lines L21 and L24 are connected with each other to transfer a signal. When the write enable signal $\overline{WE}$ becomes a low level, the transistor Q23 becomes ON state, so that the state of the flip-flop circuit is inverted to shut off the transfer gate. After that, this sate is maintained, and the operation is the same as that in FIG. 2, so that an explanation is not shown here.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A semiconductor memory device with a redundant memory cell array, comprising:

means for selecting a redundant memory cell array to substitute a faulty ordinary memory cell array which includes a faulty memory cell;
    first detecting means for detecting a selection of said redundant memory cell array to produce a select signal;
    second detecting means for detecting an address of said faulty ordinary memory cell array to produce a first address signal;
    first transferring means for transferring a signal selected from said select signal and said first address signal;
    second transferring means for transferring a signal transferred from said first transferring means; and
    means for controlling a state of an output terminal of said semiconductor memory device in accordance with a signal transferred from said second transferring means.

2. A semiconductor memory device with a redundant memory cell array, according to claim 1, wherein:

said first transfer means is a transfer gate circuit including two transfer gates, one of which transfers said select signal supplied from said first detecting means, the other transfers said address signal from said second detecting means, and said transfer gates are controlled by a second address signal, said second address signal designating an address orthogonal in matrix to an address designated by said first address signal.

3. A semiconductor memory device with a redundant memory cell array, according to claim 1, wherein:

said second transfer means is a transfer gate circuit includes a transfer gate by which said first transfer signal from said first transferring means is transferred, and a flip-flop circuit by which two different states of output lines are maintained, said transfer gate circuit being controlled by a writing control signal.

4. A semiconductor memory device with a redundant memory cell array, according to claim 3, wherein:

said transfer gate circuit further comprises a N-MOS transistor which is supplied at a gate terminal with said writing control signal.

5. A semiconductor memory device with a redundant memory cell array, according to claim 4, wherein:

said writing control signal is a signal selected from a write enable signal and a reversed write enable signal.

6. A semiconductor memory device with a redundant memory cell array, according to claim 2 or 3, wherein:

said transfer gate comprises P-MOS and N-MOS transistors, which are connected at source terminals and drain terminals each other.

7. A semiconductor memory device with a redundant memory cell array, according to claim 1, wherein:

said second transfer means further comprises two P-MOS transistors connected at source terminals and drain terminals each other, said transistors preventing a flotation of an output line of said second transferring means.

8. A semiconductor memory device with a redundant memory cell array, according to claim 1, wherein:

said controlling means comprises a NAND circuit being supplied with said second transfer signal, a chip select signal and a write enable signal, and an output buffer comprising two NOR circuits, an inverter circuit and two transistors, said controlling means being controlled by said chip select signal and said write enable signal.

9. A semiconductor memory device with a redundant memory cell array, comprising:
   means for generating a first signal indicating that an ordinal memory cell array is substituted by a redundant memory cell array;
   means for generating a second signal indicating an address of said ordinary memory cell array substituted by said redundant memory cell array;
   means for transferring a third signal selected from said first and second signals;
   means for changing an output impedance of an output circuit in said semiconductor memory device by receiving said third signal;
   wherein a substitution of said ordinary memory cell array by said redundant memory cell array is detected by said output impedance, when a first address signal selected from signals of a row and column in a matrix pattern is set to be in a first state, and an address of said substitution is detected by said output impedance, when said first address signal is set to be in a second state opposite to said first state, and a second address signal which is a remaining address of said address signals is changed.

10. A semiconductor memory device with a redundant memory cell array, according to claim 9, wherein:
    said transferring means includes first and second transfer means, said first transfer means including a first transfer gate for transferring said first signal and a second transfer gate for transferring said second signal, respectively, by said first address signal, and said second transfer means including a transfer gate for transferring said third signal by a write controlling signal.

11. A semiconductor memory device with a redundant memory cell array, according to claim 10, further comprising:
    a gate circuit for transferring said third signal to said changing means by a chip select signal and said write controlling signal.

* * * * *